(12) United States Patent
Jung

(10) Patent No.: US 12,713,758 B2
(45) Date of Patent: Aug. 18, 2026

(54) METHOD FOR FORMING PEROVSKITE LAYER

(71) Applicant: HANWHA SOLUTIONS CORPORATION, Seoul (KR)

(72) Inventor: Kwan Wook Jung, Seongnam-si (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 304 days.

(21) Appl. No.: 18/577,422

(22) PCT Filed: May 16, 2022

(86) PCT No.: PCT/KR2022/006953
§ 371 (c)(1),
(2) Date: Jan. 8, 2024

(87) PCT Pub. No.: WO2023/282457
PCT Pub. Date: Jan. 12, 2023

(65) Prior Publication Data

US 2024/0334719 A1 Oct. 3, 2024

(30) Foreign Application Priority Data

Jul. 8, 2021 (KR) ........................ 10-2021-0089488

(51) Int. Cl.
*H10K 30/57* (2023.01)
*H10K 85/50* (2023.01)

(52) U.S. Cl.
CPC ............. *H10K 30/57* (2023.02); *H10K 85/50* (2023.02); *Y02E 10/549* (2013.01)

(58) Field of Classification Search
CPC ........ C09K 11/06; H10K 85/50; Y02E 10/549
See application file for complete search history.

(56) References Cited

U.S. PATENT DOCUMENTS

2016/0109167 A1 4/2016 Xiong et al.
2018/0208611 A1 7/2018 Seok et al.
2018/0248052 A1 8/2018 Seok et al.
2019/0185495 A1* 6/2019 Cahen .................... C01G 21/16
(Continued)

FOREIGN PATENT DOCUMENTS

CN 110970562 A 4/2020
CN 112086535 A 12/2020
EP 4 369 899 A1 5/2024
(Continued)

OTHER PUBLICATIONS

Communication dated Jun. 30, 2025 in Australian Application No. 2022308773.
(Continued)

*Primary Examiner* — Jose R Diaz
(74) *Attorney, Agent, or Firm* — Sughrue Mion, PLLC

(57) ABSTRACT

The present invention relates to a method for forming a perovskite layer on a silicon layer, the method comprising the steps of: depositing a perovskite inorganic layer on the silicon layer through a vapor deposition process; and coating the inorganic layer with a perovskite organic layer through a solution process, wherein the inorganic layer is formed by sequentially or simultaneously depositing at least three inorganic halogen compounds including different halogen elements.

8 Claims, 2 Drawing Sheets

(56) References Cited

U.S. PATENT DOCUMENTS

| | | | | |
|---|---|---|---|---|
| 2021/0159426 | A1 * | 5/2021 | Huang | H01G 9/2004 |
| 2022/0122782 | A1 * | 4/2022 | Jung | H01G 9/2009 |

FOREIGN PATENT DOCUMENTS

| | | | |
|---|---|---|---|
| JP | 2018-518845 | A | 7/2018 |
| KR | 10-2016-0085720 | A | 7/2016 |
| KR | 10-2017-0026513 | A | 3/2017 |
| KR | 10-2018-0016547 | A | 2/2018 |
| KR | 10-2019-0140329 | A | 12/2019 |
| KR | 10-2019-0141477 | A | 12/2019 |
| KR | 10-2021-0015140 | A | 2/2021 |
| WO | 2019/210174 | A1 | 10/2019 |
| WO | 2020/210399 | A1 | 10/2020 |
| WO | 2023/282457 | A1 | 1/2023 |

OTHER PUBLICATIONS

Office Action issued Feb. 4, 2025 in Japanese Application No. 2024-500595.

International Search Report for PCT/KR2022/006953 dated Aug. 12, 2022.

Extended European Search Report dated May 30, 2025, issued in European application No. 22837811.3.

I. Ya. Zaitseva et al., "Interaction in the Ternary System HgBr2—PbBr2—CsBr", Russian Journal of Inorganic Chemistry, 2007, pp. 940-944, vol. 52, No. 6.

Florent Sahli et al., "Fully textured monolithic perovskite/silicon tandem solar cells with 25.2% power conversion efficiency", Nature Materials, 2018, pp. 820-826, vol. 17, No. 9 (10 pages).

Ana M. Igual-Munoz et al., "Room-Temperature Vacuum Deposition of CsPbl2Br Perovskite Films from Multiple Sources and Mixed Halide Precursors", Chemistry of Materials, 2020, pp. 8641-8652, vol. 32, No. 19.

Korean Office Action dated Sep. 23, 2024 in Application No. 10-2021-0089488.

* cited by examiner

[FIG. 1]
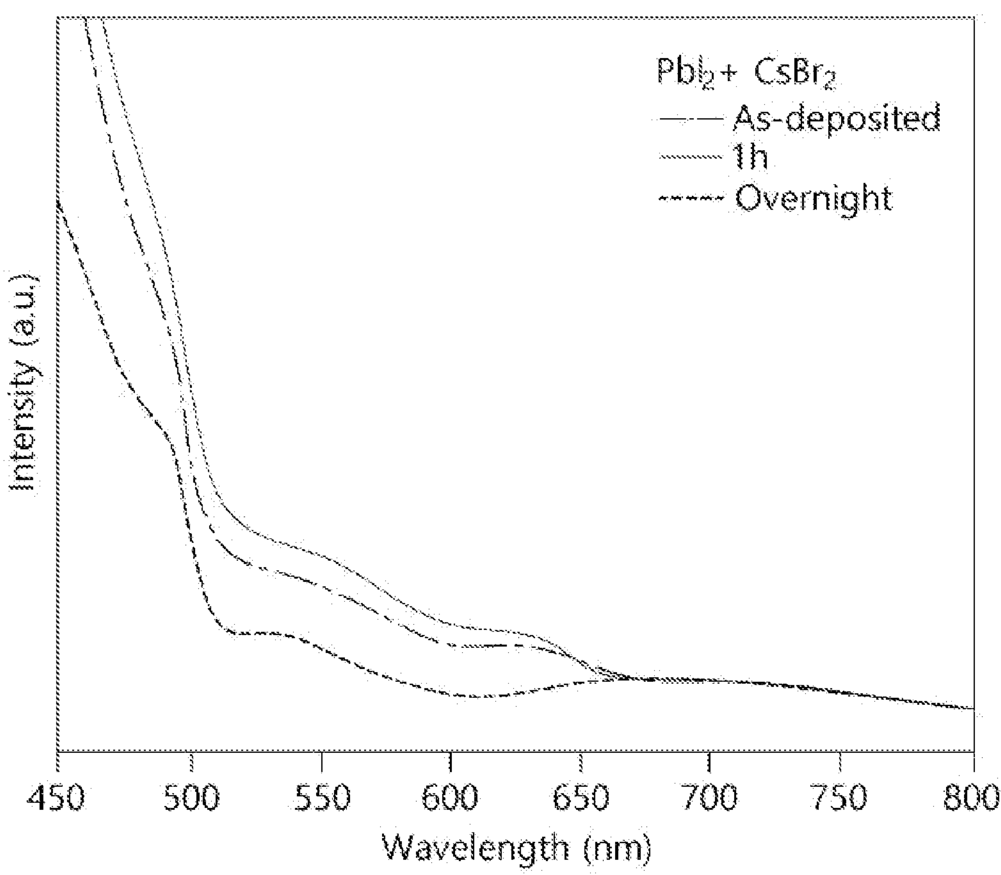
[FIG. 2]
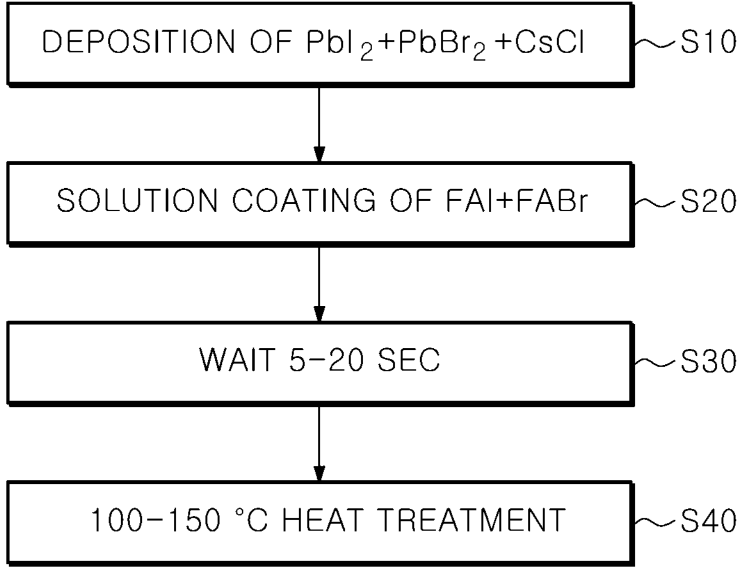

[FIG. 3]
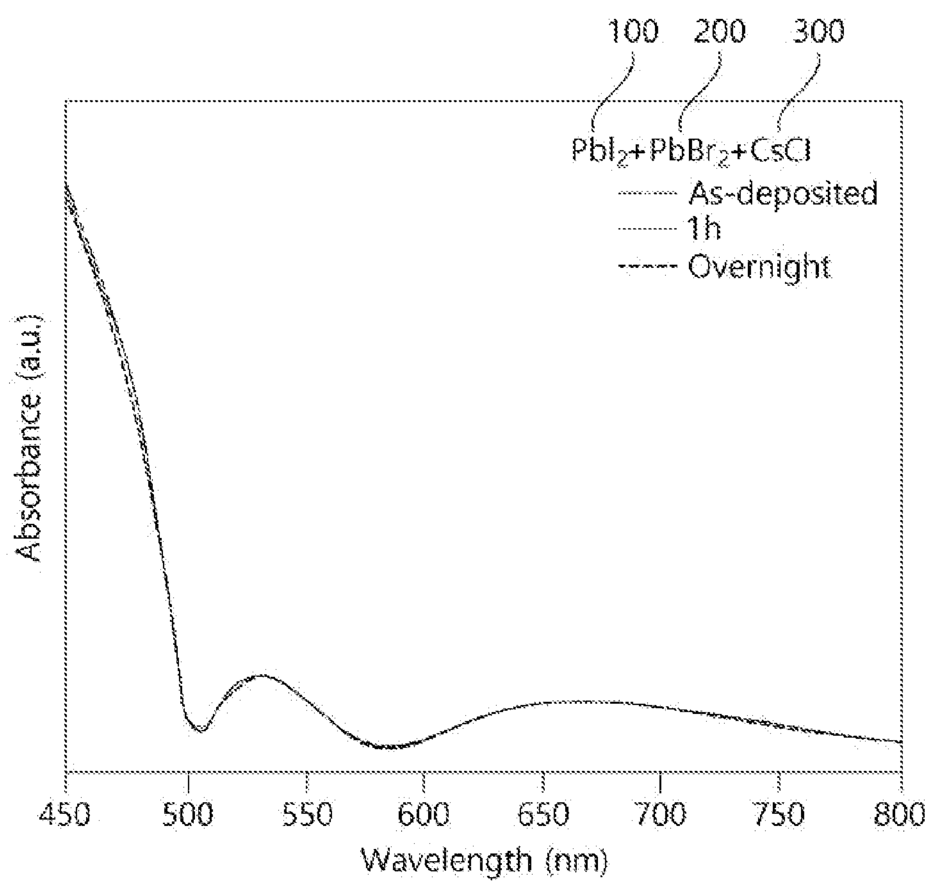

METHOD FOR FORMING PEROVSKITE LAYER

CROSS REFERENCE TO RELATED APPLICATIONS

This application is a National Stage of International Application No. PCT/KR2022/006953 filed May 16, 2022, claiming priority based on Korean Patent Application No. 10-2021-0089488 filed Jul. 8, 2021.

TECHNICAL FIELD

The present invention relates to a method of forming a photosensitizer layer, which is composed of a perovskite material and included in a tandem solar cell.

BACKGROUND ART

Solar cells are a collection of devices that convert solar energy into electricity and have long been studied while having attracted attention as next-generation energy, and it has been reported that solar cells based on various materials including silicon, CIGS, and perovskites have high photoelectric efficiencies. Currently, the most commercialized solar cells are silicon-based solar cells, which account for 90% or more of the solar cell market.

Silicon solar cells include crystalline silicon solar cells and amorphous silicon solar cells, and in the case of the crystalline silicon solar cell, manufacturing costs are high, but it is widely commercialized due to its high energy efficiency. On the other hand, in the case of the amorphous silicon solar cell, process technologies are difficult, its dependence on equipment is high, and most importantly, the development of the amorphous silicon solar cell has almost stopped due to its low efficiency. When silicon solar cells are classified as first-generation solar cells, perovskite-based solar cells are representative third-generation solar cells, which are being actively studied worldwide as a promising and eco-friendly item for the future.

Perovskite solar cells utilize materials that have a perovskite crystal structure by combining inorganic and organic materials. Perovskites have a very special structure that exhibits non-conductivity, semi-conductivity, and conductivity as well as superconductivity.

The perovskite light-absorbing layer used in perovskite solar cells is composed of perovskite materials with the structure of $ABX_3$ (where A is a monovalent organic ammonium cation or metal cation, B is a divalent metal cation, and X is a halogen anion).

Perovskites having the formula (where A is methylammonium ($CH_3NH_3^+$) or ethylammonium ($CH_3CH_2NH_3^+$), B is Pb or Sn, and X is I, Br, or Cl) may be included, but are not limited thereto.

Perovskite compounds may be, for example, $CH_3NH_3PbI_3$, $CH_3NH_3PbI_xCl_{3-x}$, $MAPbI_3$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, $(CH_3NH_3)(HC(NH_2)_2)_{1-y}PbCl_xBr_{3-x}$, and the like ($0 \le x, y \le 1$).

A perovskite has strong solar absorption and a low non-radiative carrier recombination rate, and it is known to increase conversion efficiency due to its high carrier mobility and the fact that defects that cause non-radiative carrier recombination are not formed within the bandgap or at deep levels.

These organic-inorganic hybrid perovskite solar cells are currently in the limelight as next-generation thin-film solar cells because they are inexpensive to manufacture and can be produced as thin films through a solution process. The efficiency of perovskite-based solar cells is rapidly increasing in the 10 years since research began, and their high photoelectric efficiency has been reported.

Beyond the production of thin films through solution-based spin coating, technologies such as slot die, inkjet printing, and vacuum thermal evaporation are being developed for commercialization.

In order to compensate for the shortcomings of single-junction perovskite-based solar cells, research on multi-junction tandem solar cells has been continuously conducted. In multi-junction tandem solar cells, since the upper cell with a large band gap absorbs solar energy in the low wavelength range while the lower cell with a small band gap absorbs solar energy in the high wavelength range, it is possible to reduce energy loss and use solar energy in a wide wavelength range, and thus a high efficiency of 30% or more is achieved, which cannot be achieved through a single junction.

In particular, perovskite-silicon tandem solar cells have both small and large band gaps, which are advantageous for optical operation, and thus research is being actively conducted.

However, it is not easy to make an effective tandem structure by overlapping a perovskite and silicon. The surface of silicon has a series of pyramidal structures that trap light and prevent light reflection, but it is difficult to coat this pyramid-structured surface of silicon with a uniform film of perovskite.

When a perovskite is applied in a liquid form, the perovskite usually accumulates in the valleys between the pyramidal structures on the silicon surface and peaks are exposed, which causes a problem that the perovskite is not properly applied.

To solve the above problem, a perovskite is applied onto flat silicon without the pyramidal structures, but recently, in order to maximize the efficiency gain due to light reflection, tandem solar cells have been manufactured by first completely covering the pyramidal structures on the silicon surface with an inorganic base layer of perovskite through a vapor deposition method such as vacuum thermal evaporation and then coating the top of the inorganic base layer with an organic layer through a solution deposition technique such as spin-coating.

However, with this recent technology, when 240 nm of $PbI_2$ and 80 nm of CsBr were deposited as the inorganic base layer of the perovskite, a gradual change in the inorganic base layer phase was observed, as shown in FIG. 1, through absorbance changes over time under conditions of a temperature below 20° C., a humidity below 20%, and no light.

In this way, when the inorganic base layer of the perovskite changes over time, the inorganic base layer phase is unstable, so it is difficult to know in what state the organic layer is applied, and there is a problem in that the perovskite layer formed on top of the silicon layer becomes unstable and uneven. In particular, in the case of manufacturing a large-area tandem solar cell, the time for the inorganic layer to be formed for each part/batch can vary even within the same perovskite inorganic layer, and as a result, the characteristics of the final perovskite layer after applying the organic layer for each part/batch can vary, which could be a bigger problem in terms of yield when introducing mass production technology.

DISCLOSURE

Technical Problem

The present invention is devised to solve the above-mentioned problem, and is directed to providing a device and a method of forming a perovskite layer capable of producing a large-area perovskite light-absorbing layer with high uniformity by preventing a phase of an inorganic halide-based layer, which is a precursor of the perovskite layer in a tandem solar cell, from changing over time.

Technical Solution

In order to solve the above-mentioned problem, the present invention provides a method of forming a perovskite layer on top of a silicon layer, and the method includes: depositing a perovskite inorganic layer on the top of the silicon layer by a vapor deposition process; and coating the top of the inorganic layer with a perovskite organic layer by a solution process, wherein the inorganic layer is formed by sequentially or simultaneously depositing three or more types of inorganic halogen compounds including different halogen elements.

The method may further include: waiting a predetermined time after the coating step for the inorganic layer and the organic layer to react and form an organic-inorganic perovskite thin film; and after the waiting step, heat treating the organic-inorganic perovskite thin film at a predetermined temperature for a predetermined time.

The inorganic layer may include at least one divalent metal cation and three or more types of halogen anions. The inorganic layer may further include at least one monovalent metal cation.

The monovalent metal cation may be one or more selected from alkali metal ions consisting of $Li^+$, $Na^+$, $K^+$, $Rb^+$, and $Cs^+$.

The inorganic layer may be composed of at least a first inorganic halogen compound, a second inorganic halogen compound, and a third inorganic halogen compound, and the first and second inorganic halogen compounds may have a chemical formula of $BX_2$ with different types of compounds, where B is any one cation of lead ($Pb^{2+}$), tin ($Sn^{2+}$), tungsten ($W^{2+}$), copper ($Cu^{2+}$), zinc ($Zn^{2+}$), gallium ($Ga^{2+}$), germanium ($Ge^{2+}$), arsenic ($As^{2+}$), selenium ($Se^{2+}$), rhodium ($Rh^{2+}$), palladium ($Pd^{2+}$), silver ($Ag^{2+}$), cadmium ($Cd^{2+}$), indium ($In^{2+}$), antimony ($Sb^{2+}$), osmium ($Os^{2+}$), iridium ($Ir^{2+}$), platinum ($Pt^{2+}$), gold ($Au^{2+}$), mercury ($Hg^{2+}$), thallium ($Tl^{2+}$), bismuth ($Bi^{2+}$), and polonium ($Po^{2+}$), and X is any one anion of chlorine ($Cl^-$), bromine ($Br^-$), and iodine ($I^-$), and in the third inorganic halogen compound, the cation is any one monovalent alkali metal ion selected from the group consisting of $Li^+$, $Na^+$, $K^+$, $Rb^+$, and $Cs^+$, and the halogen anion is any one selected from chlorine ($Cl^-$), bromine ($Br^-$), and iodine ($I^-$).

The inorganic layer may be formed by depositing $PbI_2$ to a thickness of 240 nm, $PbBr_2$ to a thickness of 80 nm, and CsCl to a thickness of 20 nm.

An organic halogen compound forming the organic layer may be any one methylammonium ($MA=CH_3NH^{3+}$) compound selected from the group consisting of MACl, MABr, and MAI, or any one formamidium ($FA=HC(NH_2)^{2+}$) compound selected from the group consisting of FACl, FABr, and FAI.

Advantageous Effects

A method of forming a perovskite layer according to an embodiment of the present invention has an effect of producing a large-area perovskite light-absorbing layer with high uniformity by preventing a phase of an inorganic halide-based layer, which is a precursor of the perovskite layer in a tandem solar cell, from changing over time.

DESCRIPTION OF DRAWINGS

FIG. 1 is a graph of absorbance changes over time of an inorganic base layer of perovskite produced according to the related art.

FIG. 2 is a flow diagram of a method of forming a perovskite layer according to an embodiment of the present invention.

FIG. 3 is a graph of absorbance changes over time of an inorganic base layer of perovskite produced according to an embodiment of the present invention.

MODES OF THE INVENTION

Hereinafter, embodiments will be described in detail with reference to the attached drawings. However, various modifications may be made in the embodiments, and the scope of the patent application is not limited thereto or defined thereby. It should be understood that all modifications, equivalents, and substitutes of the embodiments are included in the scope of rights.

The terms used in the embodiments are for descriptive purposes only and should not be construed as limiting. Singular expressions include plural expressions unless the context clearly indicates otherwise. In this specification, the term "include," "provide," or "have" is intended to designate the presence of the features, numbers, steps, operations, elements, components, or combinations thereof described herein, and it should be understood that it does not exclude in advance the presence or addition of other features, numbers, steps, operations, elements, components, or combinations thereof.

Unless otherwise defined, all terms, including technical or scientific terms, used herein have the same meaning as being generally understood by those who have ordinary skill in the art to which the embodiments belong. Terms defined in commonly used dictionaries should be construed to have a meaning consistent with the meaning in the context of the related art and should not be construed in an ideal or excessively formal sense unless explicitly defined in the present application.

When an element or a layer is referred to as being "connected to," "coupled to," "on," or "on top of" another element or layer, it may be understood that it may be directly on the other element or layer, or that intervening elements and layers may be present.

Hereinafter, a device and a method of forming a perovskite layer of the present invention will be described in detail with reference to the embodiments and drawings. However, the present invention is not limited thereto.

FIG. 2 is a flow diagram of a method of forming a perovskite layer according to an embodiment of the present invention, and FIG. 3 is a graph of absorbance changes over time of an inorganic base layer of perovskite produced according to an embodiment of the present invention.

As illustrated in FIG. 2, the method of forming a perovskite layer according to an embodiment of the present invention may include vapor depositing a perovskite inorganic layer (S10), applying a perovskite organic layer by a solution process (S20), waiting a predetermined time (S30), and performing heat treatment (S40).

The step of vapor depositing a perovskite inorganic layer (S10) is a step of depositing an inorganic halogen compound on top of the silicon layer constituting a tandem solar cell through a vapor deposition process. In one or more embodiments, a vacuum thermal evaporation process may be used as the vapor deposition process.

The vacuum thermal evaporation process may be, for example, performed through a chamber, which is maintained in an ultra-high vacuum state, and an evaporator installed inside the chamber. A holder capable of fixing a silicon layer may be placed on the ceiling of the chamber, and the evaporator at the bottom of the chamber may evaporate and deposit an inorganic halogen compound on the silicon layer fixed to the holder to a predetermined thickness. For precise deposition, a residual gas analyzer or a quartz crystal microbalance (QCM) sensor may be installed in the chamber.

According to an embodiment of the present invention, the perovskite inorganic layer deposited on the silicon layer in the vapor deposition process (S10) includes three or more different types of halogen elements.

According to an embodiment of the present invention, three or more types of inorganic halogen compounds including different halogen elements may be deposited sequentially or simultaneously to form the perovskite inorganic layer of the present invention.

In one or more embodiments, the perovskite inorganic layer may be formed by sequentially or simultaneously depositing a first inorganic halogen compound 100, a second inorganic halogen compound 200, and a third inorganic halogen compound 300 on the silicon layer by a vacuum thermal evaporation process, and halogen elements included in the first inorganic halogen compound 100, the second inorganic halogen compound 200, and the third inorganic halogen compound 300 are different elements.

The first inorganic halogen compound 100 may have a chemical formula of $BX_2$ (where B is a divalent metal cation, and X is a halogen anion). B may be any one cation of lead ($Pb^{2+}$), tin ($Sn^{2+}$), tungsten ($W^{2+}$), copper ($Cu^{2+}$), zinc ($Zn^{2+}$), gallium ($Ga^{2+}$), germanium ($Ge^{2+}$), arsenic ($As^{2+}$), selenium ($Se^{2+}$), rhodium ($Rh^{2+}$), palladium ($Pd^{2+}$), silver ($Ag^{2+}$), cadmium ($Cd^{2+}$), indium ($In^{2+}$), antimony ($Sb^{2+}$), osmium ($Os^{2+}$), iridium ($Ir^{2+}$), platinum ($Pt^{2+}$), gold ($Au^{2+}$), mercury ($Hg^{2+}$), thallium ($Tl^{2+}$), bismuth ($Bi^{2+}$), and polonium ($Po^{2+}$), and X may be any one anion of chlorine ($Cl^-$), bromine ($Br^-$), and iodine ($I^-$). For example, the metal halide may be $PbCl_2$, $PbBr_2$, $PbI_2$, $SnCl_2$, $SnBr_2$, and $SnI_2$.

As illustrated in FIG. 3, the first inorganic halogen compound 100 used in an embodiment of the present invention may be $PbI_2$.

The second inorganic halogen compound 200 is different from the first inorganic halogen compound 100, but like the first inorganic halogen compound, it may have a chemical formula of $BX_2$ (where B is a divalent metal cation, and X is a halogen anion). B may be any one cation of lead ($Pb^{2+}$), tin ($Sn^{2+}$), tungsten ($W^{2+}$), copper ($Cu^{2+}$), zinc ($Zn^{2+}$), gallium ($Ga^{2+}$), germanium ($Ge^{2+}$), arsenic ($As^{2+}$), selenium ($Se^{2+}$), rhodium ($Rh^{2+}$), palladium ($Pd^{2+}$), silver ($Ag^{2+}$), cadmium ($Cd^{2+}$), indium ($In^{2+}$), antimony ($Sb^{2+}$), osmium ($Os^{2+}$), iridium ($Ir^{2+}$), platinum ($Pt^{2+}$), gold ($Au^{2+}$), mercury ($Hg^{2+}$), thallium ($Tl^{2+}$), bismuth ($Bi^{2+}$), and polonium ($Po^{2+}$), and X may be any one anion of chlorine ($Cl^-$), bromine ($Br^-$), and iodine ($I^-$). For example, the metal halide may be $PbCl_2$, $PbBr_2$, $PbI_2$, $SnCl_2$, $SnBr_2$, and $SnI_2$.

As illustrated in FIG. 3, the second inorganic halogen compound 200 used in an embodiment of the present invention may be $PbBr_2$.

In the third inorganic halogen compound 300, the cation is a monovalent alkali metal ion selected from the group consisting of $Li^+$, $Na^+$, $K^+$, $Rb^+$, and $Cs^+$, and the halogen anion is any one anion selected from chlorine ($Cl^-$), bromine ($Br^-$), and iodine ($I^-$).

As illustrated in FIG. 3, the third inorganic halogen compound 300 used in an embodiment of the present invention may be CsCl.

According to an embodiment of the present invention, through a vacuum thermal evaporation process, the first inorganic halogen compound 100 ($PbI_2$) is deposited to a thickness of 240 nm, the second inorganic halogen compound 200 ($PbBr_2$) is deposited to a thickness of 80 nm, and the third inorganic halogen compound 300 (CsCl) is deposited to a thickness of 20 nm to form a perovskite inorganic layer on top of the silicon layer.

As a result of measuring the absorbance of the produced perovskite inorganic layer over time, as illustrated in FIG. 3, the absorbance of the inorganic layer was found to be almost unchanged from the absorbance at the point in time when the perovskite inorganic layer was first deposited on the silicon layer (as-deposited).

In other words, it can be seen from the absorbance measurement results illustrated in FIG. 3 that the phase of the inorganic layer measured 1 hour after depositing the perovskite inorganic layer on the silicon layer and the phase of the inorganic layer measured 24 hours after depositing the perovskite inorganic layer on the silicon layer (overnight) remain almost the same as that of the inorganic layer at the time when the perovskite inorganic layer was first deposited on the silicon layer (as-deposited).

Comparing the above result with the perovskite inorganic layer ($PbI_2$+CsBr) formed by the conventional method shown in FIG. 1, it can be seen that the absorbance of the perovskite inorganic layer ($PbI_2$+CsBr) formed by the conventional method is significantly reduced over time in the wavelength range of 450 nm to 650 nm while the absorbance of the perovskite inorganic layer ($PbI_2$+$PbBr_2$+CsCl) formed by the method of the present invention remains almost the same over time in the entire measured wavelength range (450 nm to 800 nm).

Therefore, according to the method of forming a perovskite according to an embodiment of the present invention, the perovskite inorganic layer phase remains stable over time, so it is possible to coat the top of the inorganic layer with the perovskite organic layer after accurately identifying the inorganic layer phase. Therefore, an organic-inorganic perovskite layer formed by the reaction of the organic and inorganic layers may also be stable and uniform.

In particular, in the case of manufacturing a large-area tandem solar cell, even when the time for the perovskite inorganic layer to be formed for each part/batch may vary, the state of the inorganic layer in each part does not change over time, so it is possible to form a uniform perovskite inorganic layer over the entire area, and thus a large-area perovskite light-absorbing layer with high uniformity may be manufactured.

In an embodiment of the present invention, a perovskite inorganic layer was formed by depositing three types of inorganic halogen compounds having different halogen elements, but the present invention is not limited thereto, and various combinations of three, four, five or more types of precursors such as $PbI_2$+CsBr+$PbCl_2$, $PbI_2$+CsBr+CsCl+$PbCl_2$, and the like may be used to form the inorganic layer.

Then, the top of the formed perovskite inorganic layer is coated with a perovskite organic layer by a solution process (S20). In one or more embodiments, before the coating step (S20), heat treatment may be added.

Various methods (including a spin coating method, a doctor blade coating method, a drop-casting method, an inkjet printing method, an electrostatic spray method, a slot die coating method, a spray coating method, and the like) may be used as the solution process. The solution process has an advantage of easily forming a perovskite thin film with a constant stoichiometry.

In one or more embodiments, a spin coating process may be performed as the solution process. The spin coating process involves dropping a precursor solution of a perovskite organic layer onto the top of a perovskite inorganic layer formed on a substrate and rotating the substrate, so that the excess perovskite organic layer precursor solution is removed by centrifugal force, and a uniform wet film is formed on the perovskite inorganic layer.

An organic halogen compound forming the organic layer may have a chemical formula of AX (where A is a monovalent organic ammonium cation or metal cation, and X is a halogen anion). A may be any one cation of cesium ($Cs^+$), rubidium ($Rb^+$), potassium ($K^+$), an amido group, an amidino group, or an alkali group, and X may be any one anion of chlorine ($Cl^-$), bromine ($Br^-$), iodine ($I^-$), thiocyanate ($NCS^-$), cyanine ($CN^-$), and oxyacid ($NCO^-$). The organic halogen compound may be a methylammonium ($MA=CH_3NH^{3+}$) compound (such as MACl, MABr, MAI, and the like) or a formamidium ($FA=HC(NH_2)^{2+}$) compound (such as FACl, FABr, FAI, and the like).

In one or more embodiments, FAI and FABr, which are organic halogen compounds, may be dissolved in isopropanol (IPA), and then a spin coating process may be performed with the solution to form a perovskite organic layer.

Then, after coating the top of the perovskite inorganic layer with the perovskite organic layer and waiting a predetermined time for the perovskite inorganic layer and the perovskite organic layer to react, a thin film composed of an organic-inorganic perovskite compound is formed (S30).

The waiting time for the organic-inorganic perovskite thin film to be formed is called the quenching time, and in one or more embodiments, the quenching time may be approximately 5 to 20 seconds. However, it is not limited thereto, and quenching may not be performed, depending on the penetrating power of the used solvent.

Then, the organic-inorganic perovskite thin film is heat treated at a predetermined temperature for a predetermined time and cured to form an organic-inorganic perovskite layer (S40). In one or more embodiments, the organic-inorganic perovskite thin film may be heat treated at a temperature of 100 to 150° C. for 10 to 30 minutes.

The description of the present invention described above is for illustrative purposes, and those skilled in the art will understand that the present invention may be easily modified into other specific forms without changing the technical idea or essential features of the present invention. Therefore, it should be understood that the embodiments described above are illustrative in all respects and non-restrictive. For example, each component described in a single form may be implemented in a distributed manner, and likewise, components described in a distributed form may be implemented in a combined form. The scope of the present invention is indicated by the claims described below, and all changes or modified forms derived from the meaning and scope of the claims and their equivalent concepts should be construed as being included in the scope of the present invention.

INDUSTRIAL APPLICABILITY

The present invention may be used in the field of manufacturing solar cells.

The invention claimed is:

1. A method of forming a perovskite layer on top of a silicon layer, the method comprising:

depositing a perovskite inorganic layer on the top of the silicon layer by a vapor deposition process; and coating the top of the inorganic layer with a perovskite organic layer by a solution process, wherein the inorganic layer is formed by sequentially or simultaneously depositing three or more types of inorganic halogen compounds including different halogen elements.

2. The method of claim 1, further comprising:

waiting a predetermined time after the coating step for the inorganic layer and the organic layer to react and form an organic-inorganic perovskite thin film; and heat treating the organic-inorganic perovskite thin film at a predetermined temperature for a predetermined time after the waiting step.

3. The method of claim 1, wherein the inorganic layer includes at least one divalent metal cation and three or more types of halogen anions.

4. The method of claim 3, wherein the inorganic layer further includes at least one monovalent metal cation.

5. The method of claim 4, wherein the monovalent metal cation is one or more selected from alkali metal ions consisting of $Li^+$, $Na^+$, $K^+$, $Rb^+$, and $Cs^+$.

6. The method of claim 3, wherein the inorganic layer is composed of at least a first inorganic halogen compound, a second inorganic halogen compound, and a third inorganic halogen compound, the first and second inorganic halogen compounds have a chemical formula of $BX_2$ with different types of compounds, where B is any one cation of lead ($Pb^{2+}$), tin ($Sn^{2+}$), tungsten ($W^{2+}$), copper ($Cu^{2+}$), zinc ($Zn^{2+}$), gallium ($Ga^{2+}$), germanium ($Ge^{2+}$), arsenic ($As^{2+}$), selenium ($Se^{2+}$), rhodium ($Rh^{2+}$), palladium ($Pd^{2+}$), silver ($Ag^{2+}$), cadmium ($Cd^{2+}$), indium ($In^{2+}$), antimony ($Sb^{2+}$), osmium ($Os^{2+}$), iridium ($Ir^{2+}$), platinum ($Pt^{2+}$), gold ($Au^{2+}$), mercury ($Hg^{2+}$), thallium ($Tl^{2+}$), bismuth ($Bi^{2+}$), and polonium ($Po^{2+}$), and X is any one anion of chlorine ($Cl^-$), bromine ($Br^-$), and iodine ($I^-$), in the third inorganic halogen compound, the cation is any one monovalent alkali metal ion selected from the group consisting of $Li^+$, $Na^+$, $K^+$, $Rb^+$, and $Cs^+$, and a halogen anion among the halogen anions is any one selected from chlorine ($Cl^-$), bromine ($Br^-$), and iodine ($I^-$).

7. The method of claim 6, wherein the inorganic layer is formed by depositing $PbI_2$ to a thickness of 240 nm, $PbBr_2$ to a thickness of 80 nm, and CsCl to a thickness of 20 nm.

8. The method of claim 1, wherein an organic halogen compound forming the organic layer is any one methylammonium ($MA=CH_3NH^{3+}$) compound selected from the group consisting of MACl, MABr, and MAI, or any one formamidium (FA=$HC(NH_2)^{2+}$) compound selected from the group consisting of FACl, FABr, and FAI.

* * * * *